US007529017B1

(12) United States Patent
Walker et al.

(10) Patent No.: US 7,529,017 B1
(45) Date of Patent: May 5, 2009

(54) CIRCUIT AND METHOD FOR SNAPDOWN PREVENTION IN VOLTAGE CONTROLLED MEMS DEVICES

(75) Inventors: Andrew Walker, Mountain View, CA (US); Marc Hartranft, Scotts Valley, CA (US); Michael J. Dueweke, Santa Clara, CA (US)

(73) Assignee: Silicon Light Machines Corporation, San Jose, CA (US)

( * ) Notice: Subject to any disclaimer, the term of this patent is extended or adjusted under 35 U.S.C. 154(b) by 0 days.

(21) Appl. No.: 11/448,302

(22) Filed: Jun. 7, 2006

Related U.S. Application Data

(60) Provisional application No. 60/808,404, filed on May 25, 2006.

(51) Int. Cl.
*G02B 26/00* (2006.01)

(52) U.S. Cl. ...................................... 359/291; 359/290

(58) Field of Classification Search ................ 359/237, 359/238, 290–291
See application file for complete search history.

(56) References Cited

U.S. PATENT DOCUMENTS 6,707,593 B2 3/2004 Le et al.
6,970,031 B1 11/2005 Martin et al.
7,158,281 B2 * 1/2007 Chen et al. .................. 359/291
2004/0061925 A1 * 4/2004 Azarov et al. ............... 359/291
2004/0106221 A1 * 6/2004 Hunter et al. ................. 438/21
2005/0045955 A1 * 3/2005 Kim et al. ................... 257/355
2006/0077504 A1 * 4/2006 Floyd ......................... 359/237

* cited by examiner

*Primary Examiner*—Ricky L Mack
*Assistant Examiner*—Mahidere S Sahle
(74) *Attorney, Agent, or Firm*—William E. Nuttle

(57) ABSTRACT

A circuit and method are provided for preventing snapdown in a voltage controlled Micro-Electromechanical System device having a movable actuator with an actuator electrode coupled to a first potential, the actuator suspended over a cavity electrode coupled to a second potential. Generally, the circuit includes an in-circuit conductive path between the actuator electrode and the cavity electrode, the conductive path configured to transfer charge therebetween when a voltage between the first and second potential exceeds a predetermined threshold voltage. In one embodiment the conductive path comprises an ESD clamp coupled between the actuator electrode and the cavity electrode. Other embodiments are also disclosed.

20 Claims, 5 Drawing Sheets

100
104
102a
106
102b
108

100
104
102a
106
108
102b

CIRCUIT AND METHOD FOR SNAPDOWN PREVENTION IN VOLTAGE CONTROLLED MEMS DEVICES

CROSS-REFERENCE TO RELATED APPLICATIONS

The present application claims the benefit of priority under 35 U.S.C. 119(e) to U.S. Provisional Patent Application Ser. No. 60/808,404 filed May 25, 2006, entitled Circuit And Method For Snapdown Prevention In Voltage Controlled MEMS Devices; which application is hereby incorporated by reference.

TECHNICAL FIELD

The present invention relates generally to Micro-Electromechanical Systems (MEMS) devices, and more particularly to a circuit and method for preventing snapdown in a voltage controlled MEMS device.

BACKGROUND OF THE INVENTION

In many Micro-Electromechanical System or MEMS devices, electrostatic actuation is used to move micromechanical structures. For example, one type of MEMS device that uses electrostatic actuation is a ribbon-type spatial light modulator, such as a Grating Light Valve (GLV™) commercially available from Silicon Light Machines, Inc., of Sunnyvale, Calif. Referring to FIGS. 1A and 1B, a ribbon-type spatial light modulator 100 generally includes a number of ribbons 102*a*, 102*b*; each having a light reflective surface 104 supported over a surface 106 of a substrate 108. One or more of the ribbons 102*a* are deflectable through a gap or cavity 110 toward the substrate 108 to form an addressable diffraction grating with adjustable diffraction strength. The ribbons are 102*a* deflected towards the surface 106 of the substrate 108 by electrostatic forces when a voltage is applied between electrodes 112 in the deflectable ribbons 102*a* and base electrodes 114 formed in or on the substrate. The applied voltages are controlled by drive electronics (not shown in these figures), which may be integrally formed in or on the surface 106 of the substrate 108 below or adjacent to the ribbons 102. Light reflected from the movable ribbons 102*a* adds as vectors of magnitude and phase with that reflected from stationary ribbons 102*b* or a reflective portion of the surface 106 beneath the ribbons, thereby modulating light reflected from the SLM 100.

One chronic problem encountered with conventional electrostatically operated or voltage controlled MEMS devices is referred to as "snapdown." More specifically, when the voltage applied to an actuating electrode 112 in such device exceeds a critical value, roughly that required to deflect the membrane or movable ribbons 102*a* beyond one third of the initial gap 110, the attractive force between surfaces can exceed a linear restoring force of the membrane resulting in an unstable pull-in of the surfaces also called "snapdown". Moreover, atomic-level bonding forces frequently exceed the restoring force of the membrane structure, causing the membrane to remain "stuck" to the surface of the substrate permanently damaging the ribbon and rendering the MEMS device inoperable.

Accordingly, there is a need for a circuit and method that reduces or substantially eliminates snapdown in voltage controlled MEMS devices.

The present invention provides a solution to these and other problems, and offers further advantages over conventional MEMS devices and methods of operating the same.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed to a circuit and method for preventing snapdown in a voltage controlled Micro-Electromechanical System (MEMS) device.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Figure 1A:
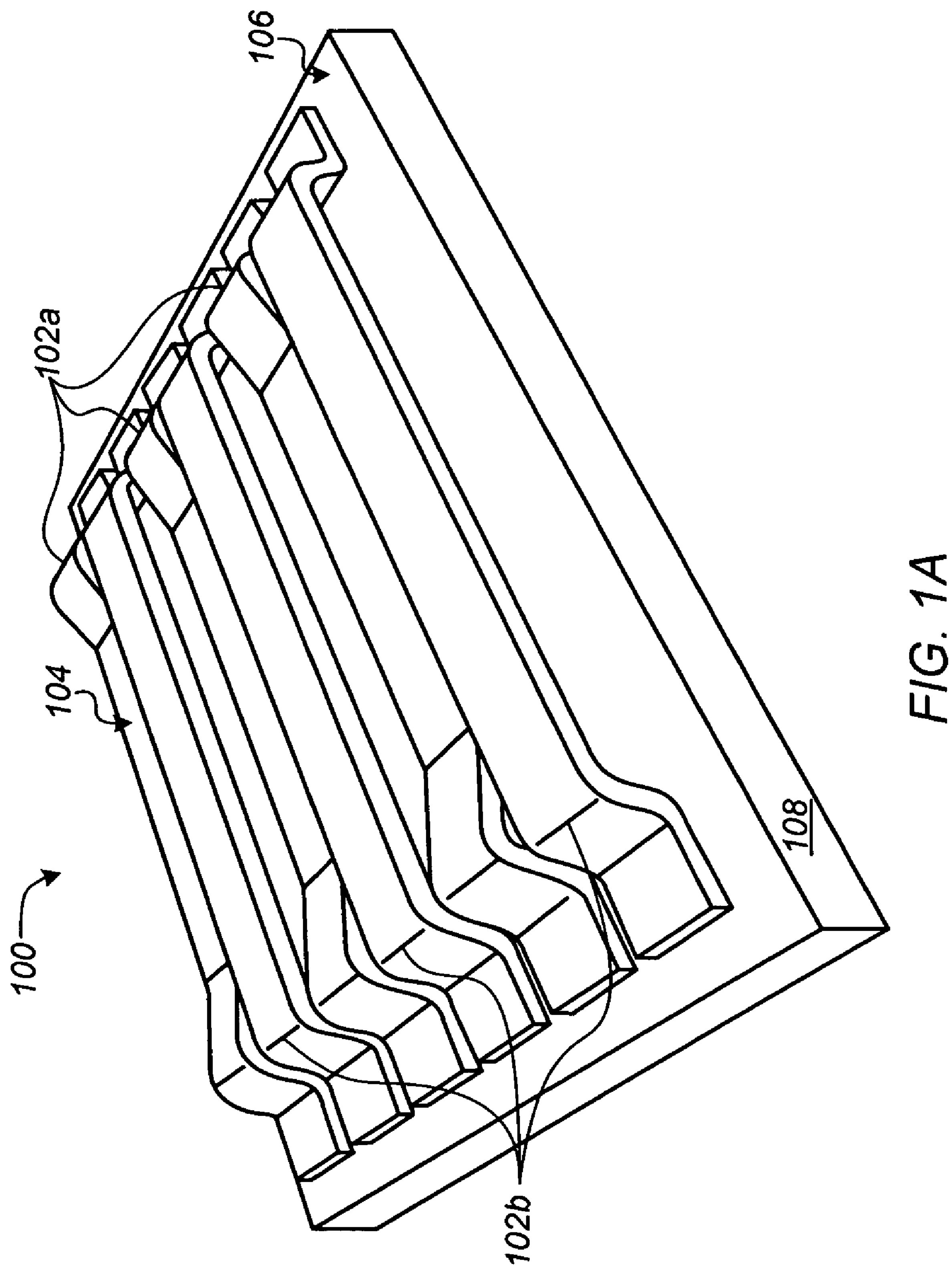
FIG. 1A (Prior Art) is a perspective view of a ribbon-type spatial light modulator (SLM) for which a circuit according to an embodiment of the present invention is particularly useful.
Figure 1B:
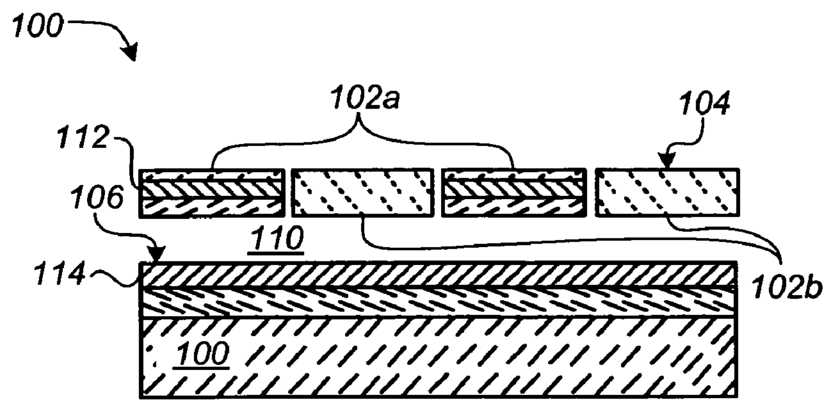
FIG. 1B (Prior Art) is a block diagram illustrating a cross-sectional view of the ribbon-type SLM of FIG. 1A.

The circuit and method of the present invention for preventing snapdown in a voltage controlled MEMS devices make it particularly suitable for use with diffractive spatial light modulators (SLMs). One type of diffractive SLM is a ribbon-type spatial light modulator, such as a Grating Light Valve (GLV™) commercially available from Silicon Light Machines, Inc., of Sunnyvale, Calif. Referring to FIG. 1A and 1B, a ribbon-type spatial light modulator 100 generally includes a number of ribbons 102 each having a light reflective surface 104 supported over a surface 106 of a substrate 108. The surface 106 may or may not be reflective. One or more of the ribbons 102*a* are deflectable toward the substrate 108 to form an addressable diffraction grating with adjustable diffraction strength. The ribbons 102*a* are deflected towards a base or cavity electrode 114 formed in or on the substrate 108 by electrostatic forces when differing voltages are applied between actuator or ribbon electrodes 112 in the deflectable ribbons 102*a* and the cavity electrode. The voltages applied to the ribbon electrodes 112 and the cavity electrodes 114 are controlled by drive circuit or driver (not shown in these figures), which may be integrally formed in or on the surface 106 of the substrate 108 below or adjacent to the ribbons 102. Light reflected from the movable ribbons 102*a* adds as vectors of magnitude and phase with that reflected from stationary ribbons 102*b* or a reflective portion of the surface 106 beneath the ribbons, thereby modulating light reflected from the SLM 100.

Figure 2:
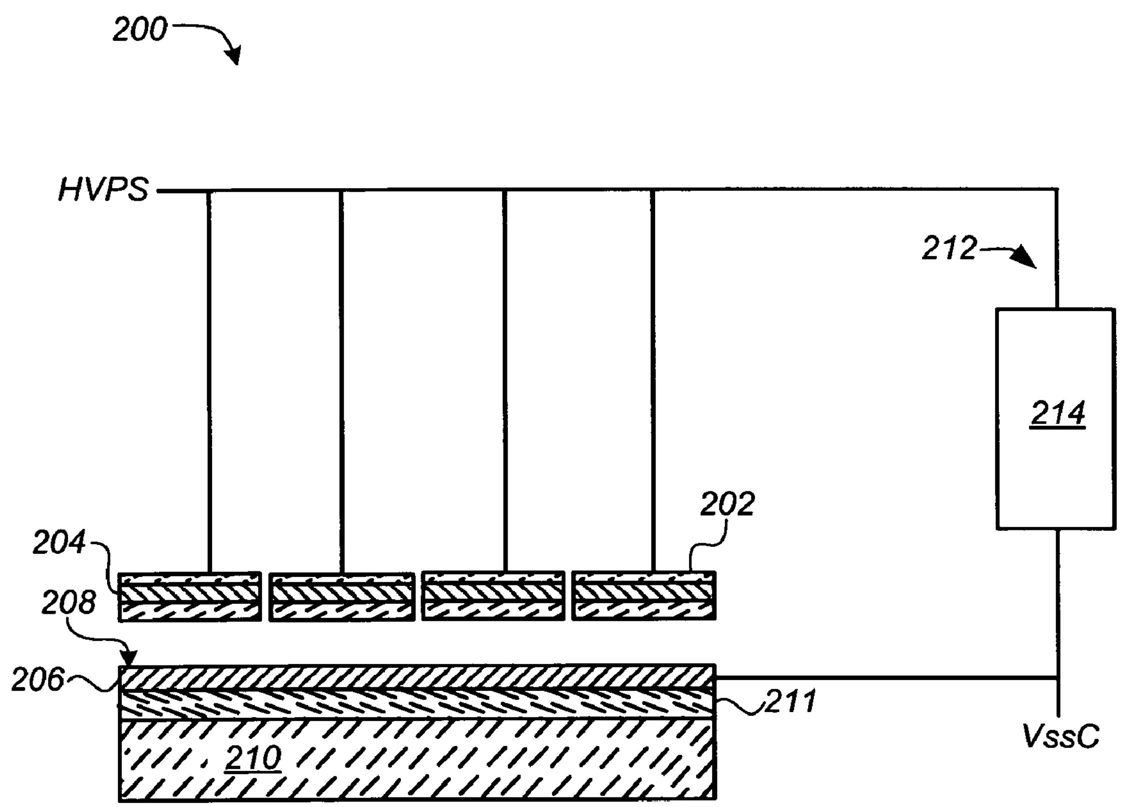
FIG. 2 is a block diagram illustrating a cross-sectional view of a ribbon-type MEMS device having coupled thereto a circuit according to an embodiment of the present invention to substantially prevent snapdown of movable ribbons of the device.

In accordance with the present invention, the MEMS device further includes a circuit for preventing snapdown or a snapdown prevention circuit. A block diagram illustrating a cross-sectional view of a ribbon-type MEMS device 200 having a snapdown prevention circuit coupled thereto is shown in FIG. 2. Referring to FIG. 2, the MEMS device 200 includes a number of movable ribbons 202 each having a ribbon electrode 204 coupled to a high voltage power supply (HVPS) through a drive circuit or driver (not shown in this figure). The movable ribbons 202 are supported over a base or cavity electrode 206 formed in or on a surface 208 of a substrate 210, which is coupled to a common backplane supply (VssC). The substrate 210 may further include or have formed thereon additional layers 211 of dielectric, conductive and semiconducting material in which integrated circuits (ICs) or devices, such as the driver and/or the snapdown prevention circuit may be integrally formed.

The HVPS generally provides a fixed or stable voltage of from about 10 to about 16 VDC, which is modulated by the driver (not shown) in response to an input signal to deflect the ribbons 202 towards the cavity electrode 206, thereby modulating light reflected from the ribbons. VssC is generally a fixed or stable voltage of from about 0 to about 16 VDC.

Figure 3:
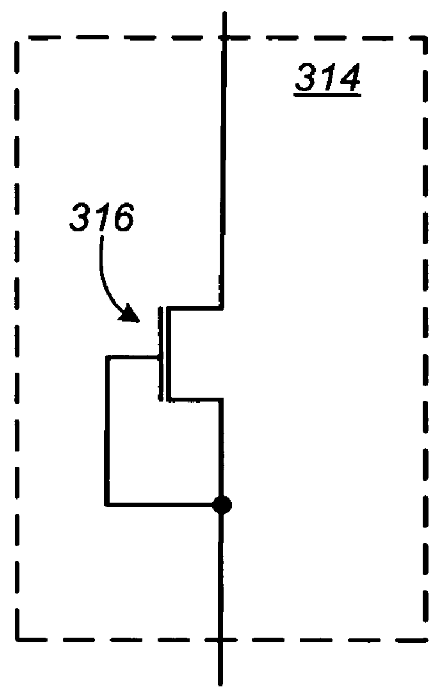
FIG. 3 is a schematic diagram of an electrostatic discharge (ESD) clamp for use in a circuit for preventing snapdown according to an embodiment of the present invention.
Figure 4:
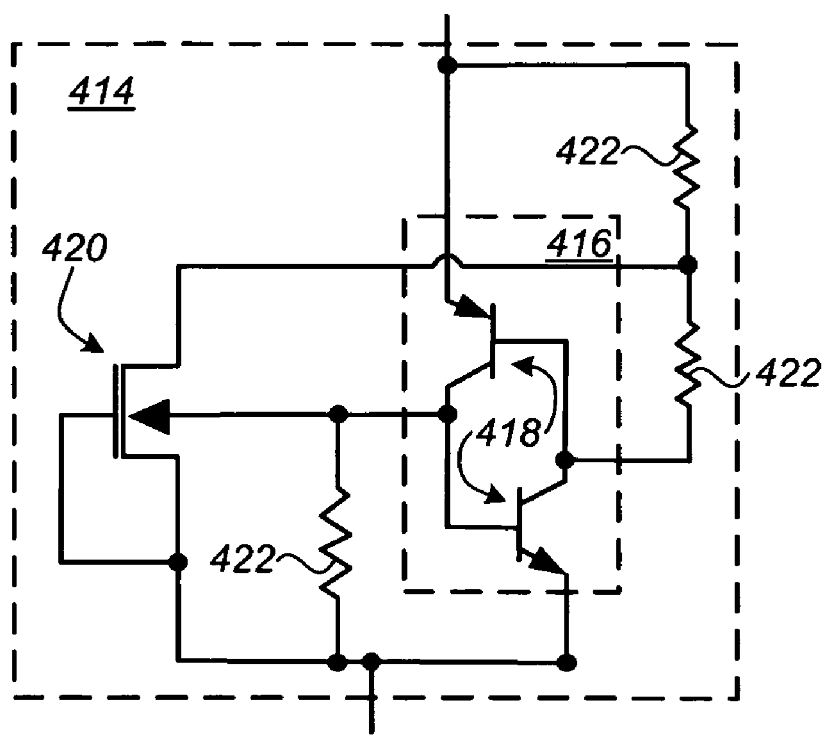
FIG. 4 is a schematic diagram of an ESD clamp for use in a circuit for preventing snapdown according to another embodiment of the present invention.

The snapdown prevention circuit generally includes an in-circuit current conduction path or conductive path 212 coupled between the ribbon electrode(s) 204 and the cavity electrode 206. The conductive path 212 is configured to transfer charge between the ribbon electrode(s) 204 and the cavity electrode 206 when a voltage between the first and second potential reaches or exceeds a predetermined threshold voltage. The conductive path 212 may include a number of interconnected circuit elements such as resistors and diodes, but generally must include at least one element 214 that is capable of switching from high impedance to low impedance once the predetermined threshold voltage is reached. Thus, in normal operation of the element 214 has high impedance but switches to low impedance once the voltage difference between the ribbon and cavity electrodes 204, 206 has reached or exceeded the predetermined threshold voltage. Preferably, the predetermined threshold voltage is selected to be sufficiently above that of the HVPS to substantially avoid false triggering of the element 214, which would interfere with normal operation of the MEMS device 200. Thus, the predetermined threshold voltage may be selected from about 5% to about 20% than that of the HVPS. For example, where the HVPS has a fixed or stable voltage of about 16 VDC the predetermined threshold voltage may be selected to trigger the switching element 214 at several volts above HVPS such as at a level of 20V. Generally, the switching element is a voltage triggerable or operable switch capable of switching from a high impedance to a low impedance and can include, for example, an electrostatic discharge (ESD) clamp, such as a reverse biased diode or a field effect transistor (FET) connected as a diode and sized and doped to have the desired impedance, low impedance, when the predetermined threshold voltage is exceeded. For example, in the embodiment shown in FIG. 3 the switching element 314 includes a high voltage, grounded gate N-type FET 316, which is adapted to provide a high impedance during normal operation of the MEMS device and to provide a low impedance when the predetermined threshold voltage is exceeded. In addition, the switching element 314 and/or the conductive path 212 may further include a number of parallel and series resistive elements or resistors to insure proper operation of the FET 316, to provide a predetermined impedance when the switching element 314 is conducting and/or to ensure correct turn-on of the switching element 314. In an alternative embodiment, shown in FIG. 4, the element or ESD clamp 414 can include a silicon controlled rectifier (SCR 416) configured to transfer charge between the ribbon electrode and the cavity electrode, and a separate trigger device to activate transfer of charge by the SCR device when the voltage between the first and second potential reaches a predetermined threshold voltage. In the embodiment shown in FIG. 4 the SCR 416 circuit includes PNP and NPN bipolar transistors 418 interconnected so that each transistor receives base current from the collector terminal of the other, and a FET 420 configured to trigger the SCR into conduction, thereby providing a low-impedance path to transfer charge between the ribbon and cavity electrodes (not shown in this figure). In the embodiment shown in FIG. 4 the ESD clamp 414 further includes a number of resistors 422 to insure proper operation of the SCR 416 and FET 420, to provide predetermined impedance when the ESD clamp is conducting and/or to limit current through the triggering element 420 when charge is transferred from the ribbons.

Embodiments of MEMS devices having a snapdown prevention circuit will now be described in greater detail with reference to FIGS. 5 and 6. It is to be understood that the embodiments shown in FIGS. 5 and 6, and the specific values for components given therein, are exemplary only, and the circuit for preventing snapdown is not limited to the embodiments and values shown.

Figure 5:
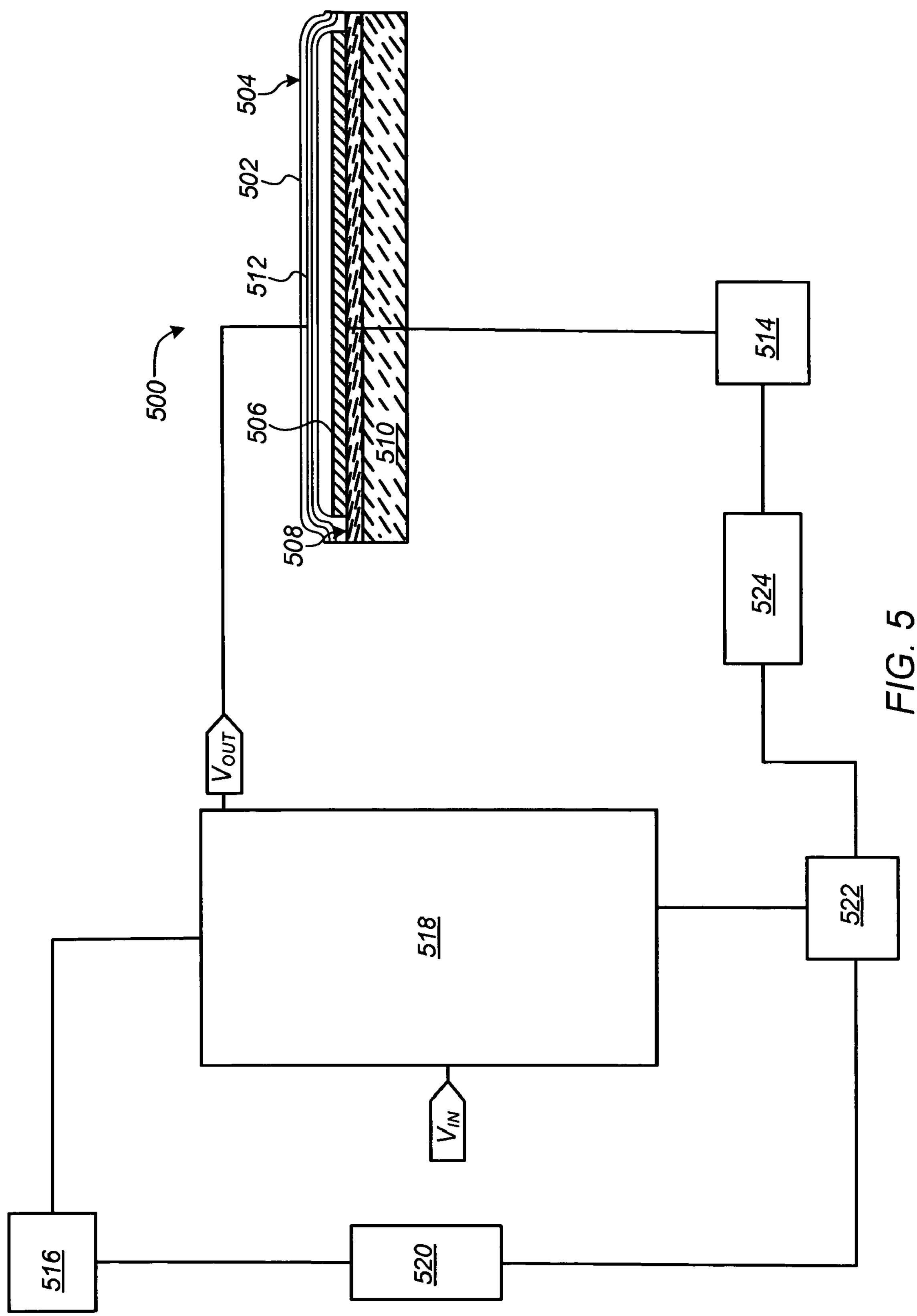
FIG. 5 is a block diagram of a circuit to substantially prevent snapdown of movable ribbons of a MEMS device according to an embodiment of the present invention.

FIG. 5 is a block diagram of a ribbon-type MEMS device, shown in sectional side-view, having a snapdown prevention circuit according to one embodiment of the present invention. Referring to FIG. 5, the MEMS device 500 includes a number of ribbons 502, only one of which is shown, each having a light reflective surface 504 supported over a base or cavity electrode 506 formed in or on the a surface 508 of a substrate 510. The movable ribbons 502 are deflected towards the cavity electrode 506 by electrostatic forces when differing voltages are applied between the cavity electrode 506, coupled to a VssC pad 514, and ribbon electrodes 512 coupled to a HVPS pad 516 through a drive circuit or driver 518.

In the embodiment shown, the conductive path of the circuit for preventing snapdown includes a first ESD clamp 520 coupled between the HVPS pad 516 and a common ground pad 522, and a second ESD clamp 524 coupled between the VssC pad 514 and the ground pad. In certain preferred embodiments, the first and second ESD clamps 520, 524, are substantially identical. However, it will be understood that this need not be the case and that the first and second ESD clamps 520, 524, may be designed to trigger, conduct at different predetermined threshold voltages, and/or to provide differing high or low impedances without departing from the spirit and scope of the present invention. For example, the voltage requirements on the nodes 516 and 514 may be different such that their respective clamps may require different trigger voltages.

Referring to FIG. 5, if a positive going voltage or potential between the HVPS pad 516 and the ground pad 522 exceeds the predetermined threshold voltage, the first ESD clamp 520 will trigger and conduct. In addition, the second ESD clamp 524, which is forward biased in this event, will also conduct enabling charge to flow from the ribbon electrode to the cavity electrode. Similarly, in the event an increasing positive potential arises on the VssC pad 514 with respect to the pad 516 then clamp 524 can trigger allowing current to flow through to 522 and then through the built-in forward biased diode in 520.

Figure 6:
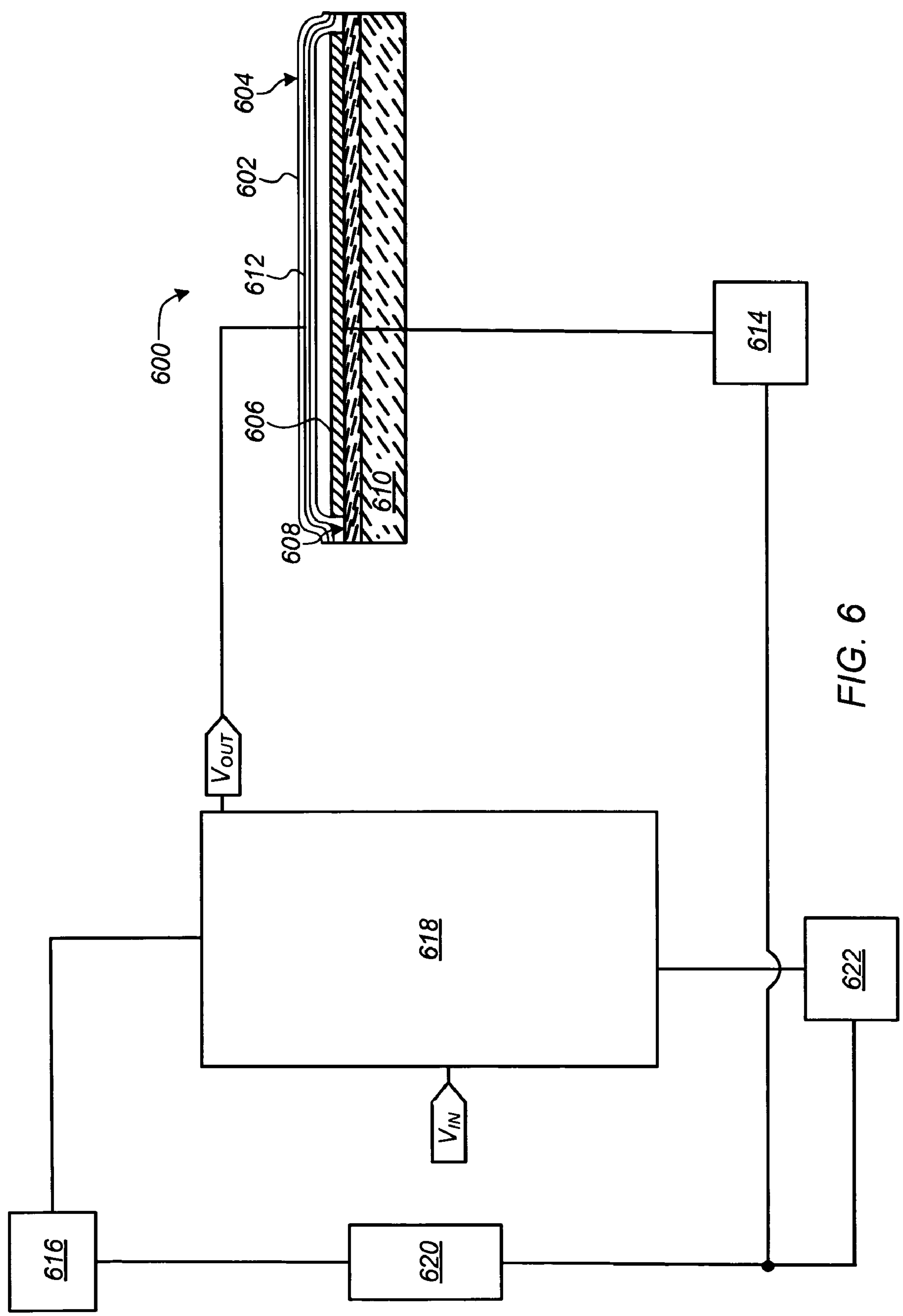
FIG. 6 is a block diagram of a circuit to substantially prevent snapdown of movable ribbons of a MEMS device according to another embodiment of the present invention.

In another embodiment, shown in FIG. 6, of the snapdown prevention circuit includes an ESD clamp coupled between the ribbon and cavity electrodes, thereby eliminating a common ground pad from the conductive path. Referring to FIG. 6, the MEMS device 600 includes a number of ribbons 602, only one of which is shown, each having a ribbon electrode 612 and a light reflective surface 604 supported over a base or cavity electrode 606 formed in or on the a surface 608 of a substrate 610, and coupled to a VssC pad 614. The ribbon electrode 612 is coupled to a HVPS pad 616 through a drive circuit or driver 618.

In the embodiment shown, the conductive path of the circuit for preventing snapdown includes a single ESD clamp 620 coupled directly between the HVPS pad 616 and the VssC pad 614, thereby eliminating the ground pad 622 from the conductive path. In operation, if a positive going voltage or potential between the HVPS pad 616 and the VssC pad 614 exceeds a predetermined threshold voltage, the ESD clamp 620 will trigger, enabling charge to flow from the ribbon electrode 612 to the cavity electrode 606.

The advantages of the snapdown prevention circuit and method of the present invention over previous or conventional approaches include: (i) a circuit solution that substantially eliminates snapdown during manufacturing, subsequent product handling, and in operation of a voltage controlled MEMS device, thereby improving yield and extending operating life of the device; (ii) elimination of the need for special handling during manufacturing, subsequent product handling; (iii) elimination of the need for special coatings and/or structures on the ribbon and/or substrate surfaces to reduce sticking of snapped down ribbons; (iv) compatible with existing designs and process flows; and (v) capability of being integrally formed on the same substrate as the MEMS device, along with a device driver, and using standard CMOS fabrication techniques.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A circuit for preventing snapdown in a voltage controlled Micro-Electromechanical System (MEMS) devices having a movable actuator with an actuator electrode coupled to a first potential, said actuator suspended over a cavity electrode coupled to a second potential, the circuit comprising:

an in-circuit conductive path between the actuator electrode and the cavity electrode, the conductive path comprising a first electrostatic discharge (ESD) clamp electrically coupled between the actuator electrode and the cavity electrode to transfer charge therebetween when a voltage between the first and second potential exceeds a predetermined threshold voltage.

2. A circuit according to claim 1, wherein the first ESD clamp is coupled to the cavity electrode through a backplane supply (VssC) pad.

3. A circuit according to claim 1, wherein the first ESD clamp is configured to provide high impedance when the voltage between the first and second potential is less than the predetermined threshold voltage, and low impedance when the voltage between the first and second potential is greater than the predetermined threshold voltage.

4. A circuit according to claim 1, wherein the first ESD clamp comprises:

a silicon controlled rectifier (SCR) configured to transfer charge between the actuator electrode and the cavity electrode; and a trigger device to activate transfer of charge by the SCR device when the voltage between the first and second potential reaches a predetermined threshold voltage.

5. A circuit according to claim 1, wherein the first ESD clamp is coupled between the actuator electrode and a common ground pad, and wherein the conductive path further comprises a second ESD clamp coupled between the cavity electrode and the common ground pad.

6. A circuit according to claim 5, wherein the second ESD clamp comprises:

a silicon controlled rectifier (SCR) configured to transfer charge between the actuator electrode and the cavity electrode; and a trigger device to activate transfer of charge by the SCR device when the voltage between the first and second potential reaches a predetermined threshold voltage.

7. A circuit according to claim 1, wherein the first ESD comprises a reverse biased diode.

8. A method for preventing snapdown in a voltage controlled Micro-Electromechanical System (MEMS) devices having a movable actuator with an actuator electrode coupled to a first potential, said actuator suspended over a cavity electrode coupled to a second potential, the method comprising a step of transferring charge between the actuator electrode and the cavity electrode through an in-circuit conductive path comprising a first electrostatic discharge (ESD) clamp electrically coupled between the actuator electrode and the cavity electrode when a voltage between the first and second potential exceeds a predetermined threshold voltage.

9. A method according to claim 8, wherein the in-circuit conductive path is configured to provide a high impedance when the voltage between the first and second potential is less than the predetermined threshold voltage, and a low impedance when the voltage between the first and second potential is greater than the predetermined threshold voltage.

10. A method according to claim 8, wherein the first ESD clamp is coupled to the cavity electrode through a backplane supply (VssC) pad.

11. A method according to claim 8, wherein the first ESD clamp is coupled between the actuator electrode and a common ground pad, and wherein the conductive path further comprises a second ESD clamp coupled between the cavity electrode and the common ground pad.

12. A voltage controlled Micro-Electromechanical System (MEMS) device comprising:

a substrate having an upper surface with a cavity electrode thereon, the cavity electrode coupled to a first potential;

a movable actuator disposed above the upper surface of the substrate, the actuator having an actuator electrode coupled to a second potential;

a driver for coupling a first potential to the actuator electrode and a second potential to the cavity electrode to generate an electrostatic force between the actuator electrode and the cavity electrode to move the movable actuator relative to the surface of the substrate; and a circuit for preventing snapdown of the movable actuator to the upper surface of the substrate, the circuit including an in-circuit conductive path between the actuator electrode and the cavity electrode, the conductive path comprising a first electrostatic discharge (ESD) clamp electrically coupled between the actuator electrode and the cavity electrode to transfer charge therebetween when a voltage between the first and second potential reaches a predetermined threshold voltage.

13. A MEMS device according to claim 12, wherein the first ESD clamp is coupled to the cavity electrode through a backplane supply (VssC) pad.

14. A MEMS device according to claim 12, wherein the first ESD clamp is configured to provide high impedance when the voltage between the first and second potential is less than the predetermined threshold voltage, and low impedance when the voltage between the first and second potential is greater than the predetermined threshold voltage.

15. A MEMS device according to claim 12, wherein the first ESD clamp comprises:

a silicon controlled rectifier (SCR) configured to transfer charge between the actuator electrode and the cavity electrode; and a trigger device to activate transfer of charge by the SCR device when the voltage between the first and second potential reaches a predetermined threshold voltage.

16. A MEMS device according to claim 12, wherein the first ESD clamp is coupled between the actuator electrode and a common ground pad, and wherein the conductive path further comprises a second ESD clamp coupled between the cavity electrode and the common ground pad.

17. A MEMS device according to claim 16, wherein the second ESD clamp comprises:

a silicon controlled rectifier (SCR) configured to transfer charge between the actuator electrode and the cavity electrode; and a trigger device to activate transfer of charge by the SCR device when the voltage between the first and second potential reaches a predetermined threshold voltage.

18. A MEMS device according to claim 16, wherein at least one of the first or second ESD clamps comprises a reverse biased diode.

19. A MEMS device according to claim 12, wherein the MEMS is a spatial light modulator (SLM).

20. A MEMS device according to claim 19, wherein the SLM is a ribbon SLM comprising a plurality of ribbons with reflective surfaces thereon disposed above and separated from a top surface of the substrate, the plurality of ribbons including at least one movable ribbon capable of being electrostatically deflected towards the surface of the substrate, and wherein the at least one movable ribbon serves as the movable actuator of the MEMS device.

* * * * *